(12) United States Patent
Wei et al.

(10) Patent No.: US 10,753,960 B2
(45) Date of Patent: Aug. 25, 2020

(54) PROBE CARD AND SIGNAL PATH SWITCHING MODULE ASSEMBLY

(71) Applicant: MPI Corporation, Chu-Pei (TW)

(72) Inventors: Hao Wei, Chu-Pei (TW); Chia-Nan Chou, Chu-Pei (TW); Chien-Chiao Chen, Chu-Pei (TW); Chia-An Yu, Chu-Pei (TW); Yu-Hao Chen, Chu-Pei (TW)

(73) Assignee: MPI CORPORATION, Chu-Pei, Hsinchu Shien (TW)

( * ) Notice: Subject to any disclaimer, the term of this patent is extended or adjusted under 35 U.S.C. 154(b) by 145 days.

(21) Appl. No.: 16/157,911

(22) Filed: Oct. 11, 2018

(65) Prior Publication Data

US 2019/0120877 A1 Apr. 25, 2019

(30) Foreign Application Priority Data

Oct. 23, 2017 (TW) .............................. 106136354 A

(51) Int. Cl.
| | |
|---|---|
| *G01R 1/073* | (2006.01) |
| *H05K 1/18* | (2006.01) |
| *H05K 1/11* | (2006.01) |
| *G01R 1/067* | (2006.01) |
| *G01R 31/28* | (2006.01) |

(52) U.S. Cl.
CPC ....... *G01R 1/07385* (2013.01); *G01R 1/0675* (2013.01); *G01R 1/06772* (2013.01); *G01R 1/07307* (2013.01); *G01R 1/07342* (2013.01); *G01R 1/07371* (2013.01); *G01R 31/2889* (2013.01); *H05K 1/111* (2013.01); *H05K 1/181* (2013.01)

(58) Field of Classification Search
CPC .............................. G01R 21/133; G01R 13/20
USPC ....... 324/762.09, 76.11, 76.61, 76.69, 76.74, 324/103
See application file for complete search history.

(56) References Cited

U.S. PATENT DOCUMENTS

| | | | |
|---|---|---|---|
| 2017/0069696 A1* | 3/2017 | Kondo | ................ H01L 51/5271 |
| 2017/0077190 A1* | 3/2017 | Hashimoto | ............. H01L 51/56 |
| 2017/0098398 A1* | 4/2017 | Amatsuchi | ......... G01M 11/0264 |

FOREIGN PATENT DOCUMENTS

| | | |
|---|---|---|
| TW | I471570 B | 2/2015 |
| TW | I474008 B | 2/2015 |
| TW | I489113 B | 6/2015 |

(Continued)

*Primary Examiner* — Giovanni Astacio-Oquendo
(74) *Attorney, Agent, or Firm* — Muncy, Geissler, Olds & Lowe, P.C.

(57) ABSTRACT

A probe card includes a printed circuit board (PCB), a connection substrate electrically connected with the PCB, a probe head, and a signal path switching module disposed on a lateral periphery surface or a bottom surface of the connection substrate, electrically connected with probe needles of the probe head and the connection substrate and including first and second circuit lines with first and second inductors respectively, and a capacitor electrically connected between the first and second circuit lines. A test signal from a tester is transmitted between the tester and a device under test (DUT) via the PCB, the connection substrate, the first and second circuit lines and the probe needles. A loopback test signal from the DUT is transmitted back to the DUT via the probe needles, parts of the first and second circuit lines and the capacitor.

19 Claims, 14 Drawing Sheets

(56) References Cited

FOREIGN PATENT DOCUMENTS

| TW | I493194 B | 7/2015 |
|----|-----------|--------|
| TW | I529395 B | 4/2016 |

\* cited by examiner

PROBE CARD AND SIGNAL PATH SWITCHING MODULE ASSEMBLY

BACKGROUND OF THE INVENTION

1. Field of the Invention

The present invention relates generally to a probe card and more particularly, to a probe card provided with a signal path switching module, and a signal path switching module assembly used in the probe card.

2. Description of the Related Art

A probe card is a transmission interface for transmitting a test signal between a tester and an electronic component under test (hereinafter referred to as "device under test" or "DUT"). It is well known that switching the signal transmission path by relay or circuit composed of capacitors and inductors provided on the probe card enables a same probe needle provided on the probe card to transmit a test signal such as a direct-current or low-frequency signal from the tester or transmit a high-frequency loopback test signal from the DUT. For related prior arts, Taiwan Patent Nos. 1471570, 1474008, 1489113, 1493194 and 1529395 can be referred to.

The electronic components such as the relays, the capacitors and the inductors used in the abovementioned prior arts are usually disposed by welding one by one on a surface or in a recess processed on a surface of a printed circuit board or a connection substrate such as a space transformer or disposed in the circuit board in an embedding manner. Therefore, the processing and assembling of the probe cards disclosed in the above-mentioned prior arts are complicated, time-consuming and not cost effective. Besides, the design of the electronic products presently trends to minimization and multi-function, resulting in a massive increase in the amount of the contact pads of the DUT for the high-frequency loopback test, so that the probe card should be correspondingly provided with relatively more high-frequency loopback test channels. However, the printed circuit board and the connection substrate of the presently available probe card are crowded on the surfaces thereof by various kinds of electronic components such as jumpers, insertion slots, passive elements, and so on, thereby hard to provide appropriate space to accommodate the additional electronic components, such as relays, inductors and capacitors, necessarily provided for the massive increase of the amount of the high-frequency loopback test channels. Therefore, how to use the limited space of the presently available probe card to provide relatively more test channels is a serious problem to be solved by the manufacturers in this industry field.

SUMMARY OF THE INVENTION

The present invention has been accomplished in view of the above-noted circumstances. It is one of the objectives of the present invention to provide a probe card provided with a signal path switching module, which is efficient in space utilization and convenient in assembly, and effectively increases the amount of the test channels.

To attain the above objective, the present invention provides a probe card which includes a printed circuit board, a connection substrate, a probe head, and a signal path switching module. The connection substrate is disposed under the printed circuit board and provided with a plurality of signal circuit lines electrically connected with the printed circuit board. The plurality of signal circuit lines includes a first signal circuit line and a second signal circuit line. The probe head is disposed under the connection substrate and provided with a first probe needle and a second probe needle, which are electrically connected with the first and second signal circuit lines. The signal path switching module is disposed on a lateral periphery surface or a bottom surface of the connection substrate and provided with a test channel set. The test channel set includes a first circuit line, a second circuit line, and a capacitor. The aforesaid first circuit line has a first contact pad electrically connected with the first signal circuit line of the connection substrate, a second contact pad electrically connected with the first probe needle, and a first inductor located between the first and second contact pads. The aforesaid second circuit line has a first contact pad electrically connected with the second signal circuit line of the connection substrate, a second contact pad electrically connected with the second probe needle, and a second inductor located between the first and second contact pads. The capacitor has a first electric contact and a second electric contact. The first electric contact of the capacitor is electrically connected between the second contact pad of the first circuit line and the first inductor. The second electric contact of the capacitor is electrically connected between the second contact pad of the second circuit line and the second inductor. As a result, the test signal from the tester can be transmitted via the printed circuit board, the connection substrate, the first and second circuit lines of the signal path switching module and the first and second probe needles, and the loopback test signal from the DUT can be transmitted back to the DUT via the first probe needle, a part of the first circuit line, the capacitor and a part of the second circuit line of the signal path switching module, and the second probe needle.

Based on the abovementioned technical features disclosed in the present invention, the electronic components required to compose a set or a plurality of sets of test channels for being switched to transmit one or more test signals from the tester or being switched to transmit one or more loopback test signals from the DUT can be encapsulated into a module, i.e. the abovementioned signal path switching module, and the integrated module is disposed on the lateral periphery surface or the bottom surface of the connection substrate. In this way, it is not required to weld the passive elements such as the capacitors and the inductors one by one, so that the objectives of efficient space utilization, convenient assembly and effective increase in the amount of the test channels are attained.

Besides, the present invention further provides a probe card which includes a printed circuit board, a connection substrate disposed under the printed circuit board, a probe head disposed under the connection substrate, and a signal channel expanding board. The signal channel expanding board has a substrate located and electrically connected between the connection substrate and the probe head, and a signal path switching module configured as the abovementioned signal path switching module and disposed on and electrically connected with the substrate. Through the aforesaid technical features, under the condition that the arrangement of the test contact pads of the presently available probe card is not affected, the signal channel expanding board, which is disposed between the connection substrate and the probe head, can provide relatively more high-frequency loopback test channels around the periphery of the probe head. In this way, the probe card can be conveniently assembled and effectively increase the amount of the test channels, and can be custom made according to the requirements of the client with a large number of high-frequency loopback test channels.

Moreover, the present invention further provides a signal path switching module assembly for a probe card, which includes two abovementioned signal path switching modules piled on one another in one of the manners that the bottom surfaces of the signal path switching modules face each other, the top surface of one of the signal path switching modules faces the bottom surface of the other signal path switching module and the top surfaces of the signal path switching modules face each other, and all of the first and second contact pads are staggered. In this way, in the miniaturized volume, more sets of test channels provided for being switched to transmit the test signals from the tester or being switched to transmit the loopback test signals from the DUT can be provided. Further, the piled module assembly is disposed on the lateral periphery surface or the bottom surface of the connection substrate or the top surface or the bottom surface of the substrate of the abovementioned signal channel expanding board, so that the objectives of efficient space utilization, convenient assembly and effective increase of the test channels are attained.

The abovementioned features and advantages of the present invention will become more fully understood from the detailed description of the instanced embodiments given herein below and the accompanying drawings.

DETAILED DESCRIPTION OF THE INVENTION

Figure 1:
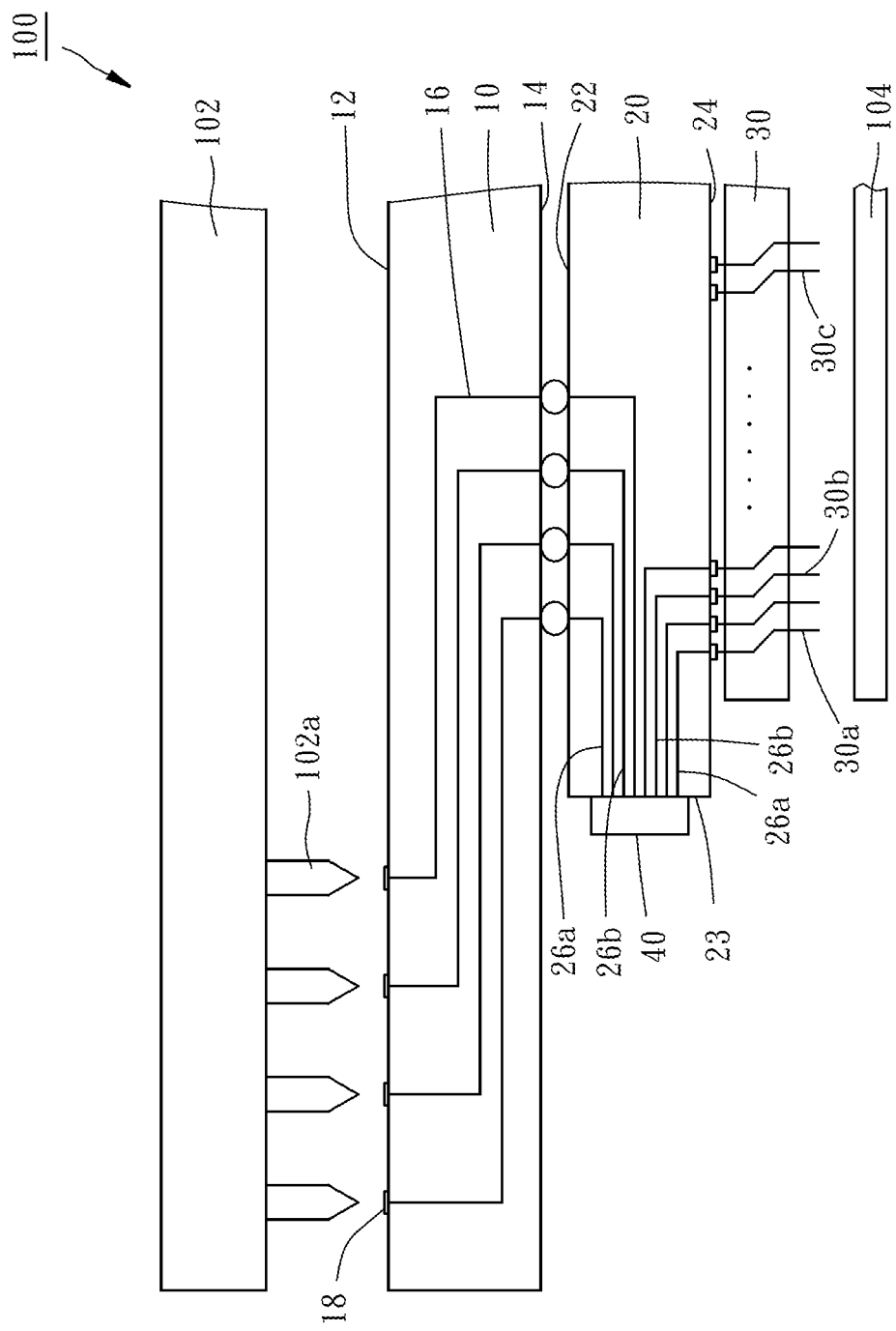
FIG. 1 is a schematic structural view of a probe card according to a first embodiment of the present invention.

First of all, it is to be mentioned that same or similar reference numerals used in the following embodiments and the appendix drawings designate same or similar elements or the structural features thereof throughout the specification for the purpose of concise illustration of the present invention. It should be noticed that for the convenience of illustration, the components and the structure shown in the figures are not drawn according to the real scale and amount, and the features mentioned in each embodiment can be applied in the other embodiments if the application is possible in practice. Besides, in the embodiments and the claims of the present invention, when it is mentioned that an element is "electrically connected" with another element, it means that the elements are electrically conducted with each other directly through an electric connector such as, but unlimited to, contact pad, lead, circuit line, electric wire, electric cable, and so on, or the elements are electrically conducted with each other indirectly through not only the aforesaid electric connector but also one or more other elements.

As shown in FIGS. 1-5, a probe card 100 according to a first embodiment of the present invention primarily includes a printed circuit board 10, a connection substrate 20, a probe head 30, and a signal path switching module 40. The probe card 100 is disposed between a tester 102 and a DUT 104 to serve as a transmission interface for transmitting one or more test signals, such as direct-current or low-frequency signals, from the tester 102 between the tester 102 and the DUT 104 or transmitting one or more loopback test signals, such as high-frequency signals, from the DUT 104 back to the DUT 104.

The printed circuit board 10 in this embodiment is a general printed circuit board having a top surface 12, a bottom surface 14, a plurality of signal circuit lines 16 located inside the printed circuit board 10, and contact pads formed on the top surface 12 and the bottom surface 14 and electrically connected with the signal circuit lines 16, such as the contact pads 18 that are located on the top surface 12 schematically drawn in FIG. 1. By means of using pogo pins 102a of the tester 102 to contact the contact pads 18, the test signals from the tester 102 can be transmitted to the bottom surface 14 of the printed circuit board 10 via the aforesaid signal circuit lines 16.

The connection substrate 20 in this embodiment is, but unlimited to, a space transformer formed by a multilayer organic (MLO) substrate, a multilayer ceramic (MLC) substrate, and so on. That means, the connection substrate 20 is provided with a plurality of internal signal circuit lines and a plurality of contact pads located on its top surface and the bottom surface and electrically connected with the internal signal circuit lines in a way that the intervals between the contact pads on the top surface greater than the intervals between the contact pads on the bottom surface. The connection substrate 20 is mechanically disposed on and electrically connected with the bottom surface 14 of the printed circuit board 10 and disposed under the printed circuit board 10 in a way that the contact pads on the top surface of the connection substrate 20 are electrically connected with the contact pads on the bottom surface 14 of the printed circuit board 10 so that the signal circuit lines in the connection substrate 20 are electrically connected with the signal circuit lines 16 of the printed circuit board 10. In this embodiment, the connection substrate 20 has a top surface 22, a bottom surface 24, and a lateral periphery surface 23 connecting the top and bottom surfaces 22 and 24. The signal circuit lines in the connection substrate 20 includes a plurality of sets of first signal circuit line 26a and second signal circuit line 26b, which extend between the top surface 22 and the lateral periphery surface 23 and between the lateral periphery surface 23 and the bottom surface 24. Specifically speaking, each of the first signal circuit line 26a and the second signal circuit line 26b has a section extending between the top surface 22 and the lateral periphery surface 23 and provided with contact pads on the top surface 22 and the lateral periphery surface 23, and another section extending between the lateral periphery surface 23 and the bottom surface 24 and provided with contact pads on the lateral periphery surface 23 and the bottom surface 24. Through the signal path switching module 40 to be described in the following paragraphs, the sections of each of the first and second signal circuit lines 26a and 26b are electrically connected to become complete first and second signal circuit lines 26a and 26b.

The probe head 30 is disposed under the bottom surface 24 of the connection substrate 20 and located above the DUT 104. The probe head 30 is provided with a large number of probe needles. The bottom end of the probe needle is adapted to contact the DUT 104, and the top end of the probe needle is abutted on the contact pad located on the bottom surface 24 of the connection substrate 20, so that the test signal from the tester 102 can be transmitted between the tester 102 and the DUT 104 via the probe needles, the signal circuit lines in the connection substrate 20 and the signal circuit lines in the printed circuit board 10. In this embodiment, the large number of probe needles of the probe head 30 includes a set or a plurality of sets of first probe needle 30a and second probe needle 30b for selectively transmitting the test signal from the tester 102 or transmitting the loopback test signal from the DUT 104, and other probe needles such as third probe needles 30c only for transmitting the test signal from the tester 102. The top ends of the first and second probe needles 30a and 30b are respectively abutted on the contact pads of the first and second signal circuit lines 26a and 26b of the connection substrate 20, which are located on the bottom surface 24 of the connection substrate 20. The top ends of the third probe needles 30c are abutted on the contact pads of other signal circuit lines in the connection substrate 20, which are located on the bottom surface 24 of the connection substrate 20.

The signal path switching module 40 is an encapsulated module provided therein with specific passive elements and having exposed contact pads. In this embodiment, the signal path switching module 40 is disposed on the lateral periphery surface 23 of the connection substrate 20, and the contact pads of the signal path switching module 40 are electrically connected with the contact pads of the sections of the first and second signal circuit lines 26a and 26b of the connection substrate, which are located on the lateral periphery surface 23 of the connection substrate 20. In this way, the test signal from the tester 102 can be transmitted between the tester 102 and the DUT 104 via the printed circuit board 10, the first and second signal circuit lines 26a and 26b of the connection substrate 20, the signal path switching module 40 and the first and second probe needles 30a and 30b. Alternatively, the high-frequency loopback test signal can be transmitted via the connection substrate 20, the signal path switching module 40 and the first and second probe needles 30a and 30b. Detailed description of the internal structure of the signal path switching module 40 and the electrically connected relationship among the signal path switching module 40, the connection substrate 20 and the first and second probe needles 30a and 30b will be given hereunder.

Figure 2:
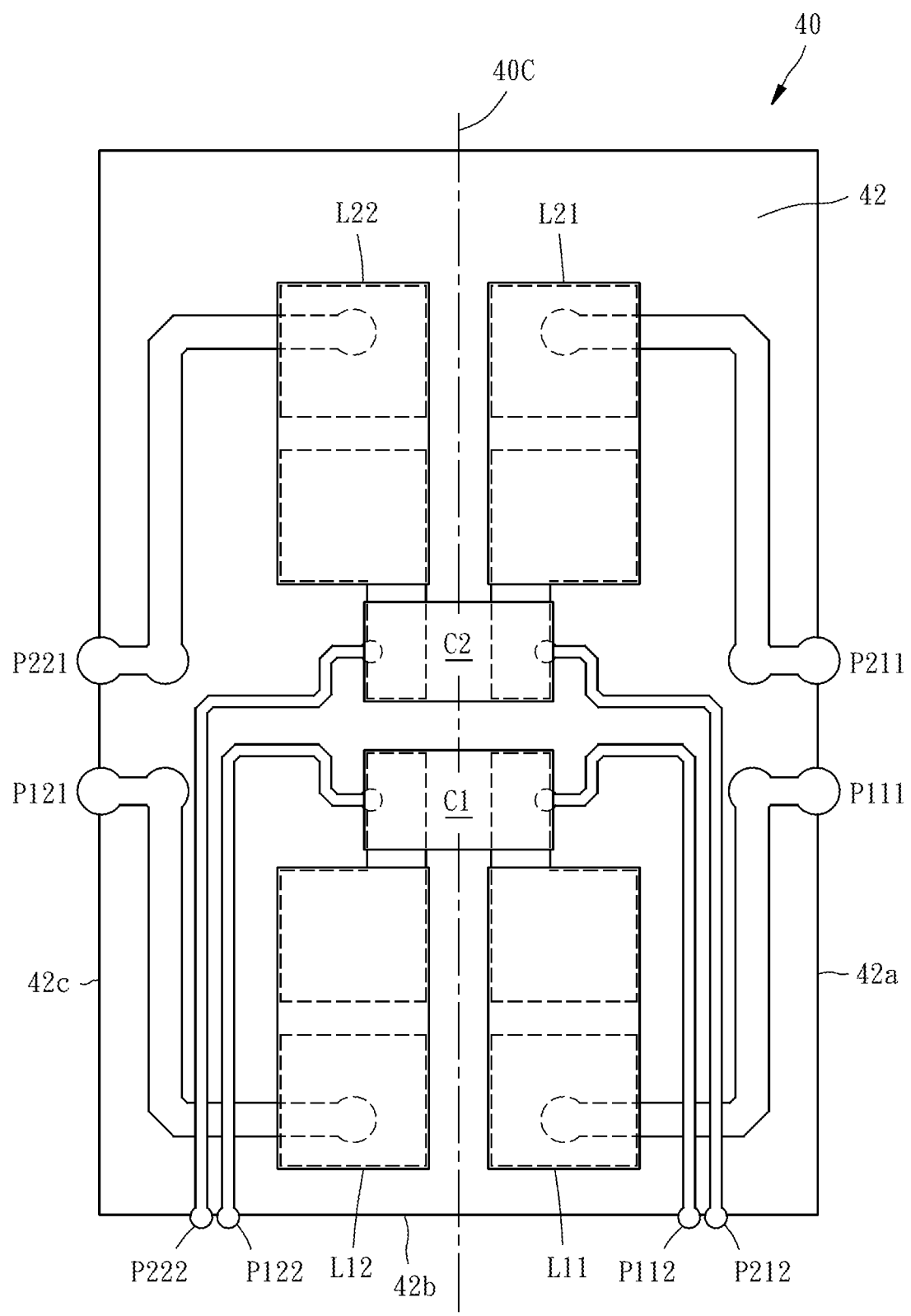
FIG. 2 is a schematic view showing the internal structure of a signal path switching module used in the aforesaid probe card.
Figure 3:
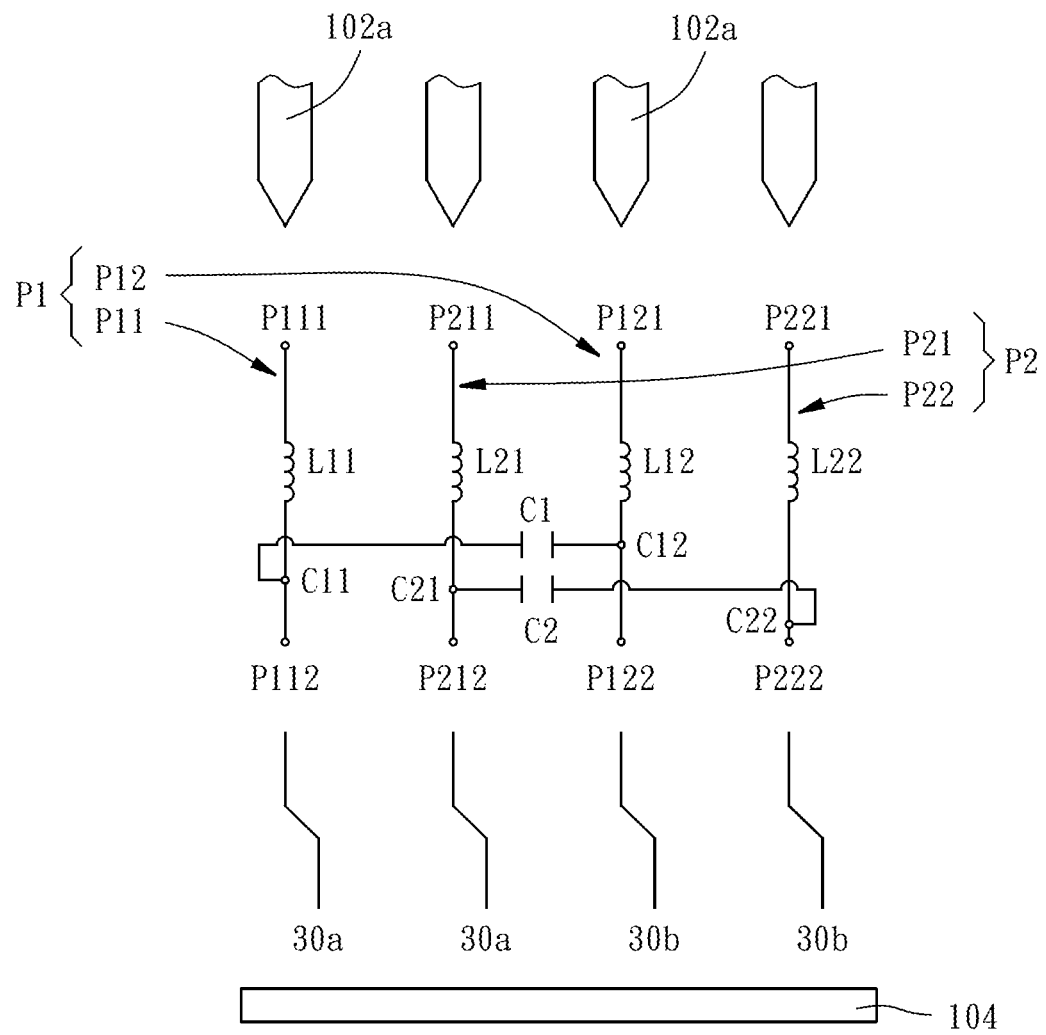
FIG. 3 is a schematic circuit diagram of the signal path switching module shown in FIG. 2.

Referring to FIGS. 2-3, the signal path switching module 40 includes a substrate 42, which is encapsulated in an insulating encapsulant and formed by a circuit board having specific circuit lines, two capacitors C1 and C2 disposed on the central portion of the substrate 42, and four inductors L11, L12, L21 and L22 disposed around the periphery of the capacitors C1 and C2 symmetrically, thereby forming first and second test channel sets P1 and P2. Each of the first and second test channel sets P1 and P2 has a first circuit line P11 or P21, a second circuit line P12 or P22, and a capacitor C1 or C2.

Specifically speaking, each of the first circuit lines P11 and P21 has a first contact pad P111 or P211 exposed on a first side 42a of the encapsulant, a second contact pad P112 or P212 exposed on a second side 42b of the encapsulant, which is located adjacent to the first side 42a, and a first inductor L11 or L21 located between the first and second contact pads P111 and P112 or P211 and P212. The first contact pads P111, P211 and the second contact pads P112 and P212 are electrically connected with the contact pads of the first signal circuit lines 26a of the connection substrate 20 respectively, which are located on the lateral periphery surface 23 of the connection substrate 20, so that the first circuit lines P11 and P21 can be electrically connected with the first probe needles 30a via the first signal circuit lines 26a respectively.

Each of the second circuit lines P12 and P22 has a first contact pad P121 or P221 exposed on a third side 42c of the encapsulant, which is located opposite to the first side 42a and adjacent to the second side 42b, a second contact pad P122 or P222 exposed on the second side 42b of the encapsulant, and a second inductor L12 or L22 located between the first and second contact pads P121 and P122 or P221 and P222. The first contact pads P121, P221 and the second contact pads P122 and P222 are electrically connected with the contact pads of the second signal circuit lines 26b of the connection substrate 20 respectively, which are located on the lateral periphery surface 23 of the connection substrate 20, so that the second circuit lines P12 and P22 can be electrically connected with the second probe needles 30b via the second signal circuit lines 26b respectively.

Besides, as shown in FIG. 2, in the first test channel set P1, the first circuit line P11, which is composed of the first contact pad P111, parts of the circuit lines of the substrate 42, the first inductor L11 and the second contact pad P112, and the second circuit line P12, which is composed of the first contact pad P121, parts of the circuit lines of the substrate 42, the second inductor L12 and the second contact pad P122, are arranged in the signal path switching module 40 symmetrically to each other with respect to a central line 40C of the signal path switching module 40. Likewise, in the second test channel set P2, the first circuit line P21, which is composed of the first contact pad P211, parts of the circuit lines of the substrate 42, the first inductor L21 and the second contact pad P212, and the second circuit line P22, which is composed of the first contact pad P221, parts of the circuit lines of the substrate 42, the second inductor L22 and the second contact pad P222, are arranged in the signal path switching module 40 symmetrically to each other with respect to the aforesaid central line 40C.

Each of the capacitors C1 and C2 has a first electric contact C11 or C21 and a second electric contact C12 or C22. The first electric contact C11 of the capacitor C1 is electrically connected between the second contact pad P112 of the first circuit line P11 of the first test channel set P1 and the first inductor L11. The second electric contact C12 of the capacitor C1 is electrically connected between the second contact pad P122 of the second circuit line P12 and the second inductor L12. The first electric contact C21 of the capacitor C2 is electrically connected between the second contact pad P212 of the first circuit line P21 of the second test channel set P2 and the first inductor L21. The second electric contact C22 of the capacitor C2 is electrically connected between the second contact pad P222 of the second circuit line P22 and the second inductor L22.

Referring to FIG. 2 again, it is to be mentioned that the length of the circuit line between the second contact pad P112 of the first circuit line P11 of the first test channel set P1 and the capacitor C1 is preferably arranged to be equal to the length of the circuit line between the second contact pad P212 of the first circuit line P21 of the second test channel set P2 and the capacitor C2, and the length of the circuit line between the second contact pad P122 of the second circuit line P12 of the first test channel set P1 and the capacitor C1 is also preferably arranged to be equal to the length of the circuit line between the second contact pad P222 of the second circuit line P22 of the second test channel set P2 and the capacitor C2. In this way, the length of the circuit line for transmitting the loopback test signal from the DUT 104 via the second contact pad P122, the capacitor C1 and the second contact pad P112 is equal to the length of the circuit line for transmitting the loopback test signal via the second contact pad 222, the capacitor C2 and the second contact pad P212. Besides, in this embodiment, the second contact pads P222 and P122 are disposed on the second side 42b of the signal path switching module 40 and located between the third side 42c and the second inductor L12, and the second contact pads P112 and P212 are disposed on the second side 42b and located between the first side 42a and the first inductor L11. However, the positions of the second contact pads P222, P122, P112 and P212 are unlimited to those disclosed in this embodiment. They can be arranged at other proper positions to increase the flexibility of layout of the circuit lines of the substrate 42.

Figure 4:
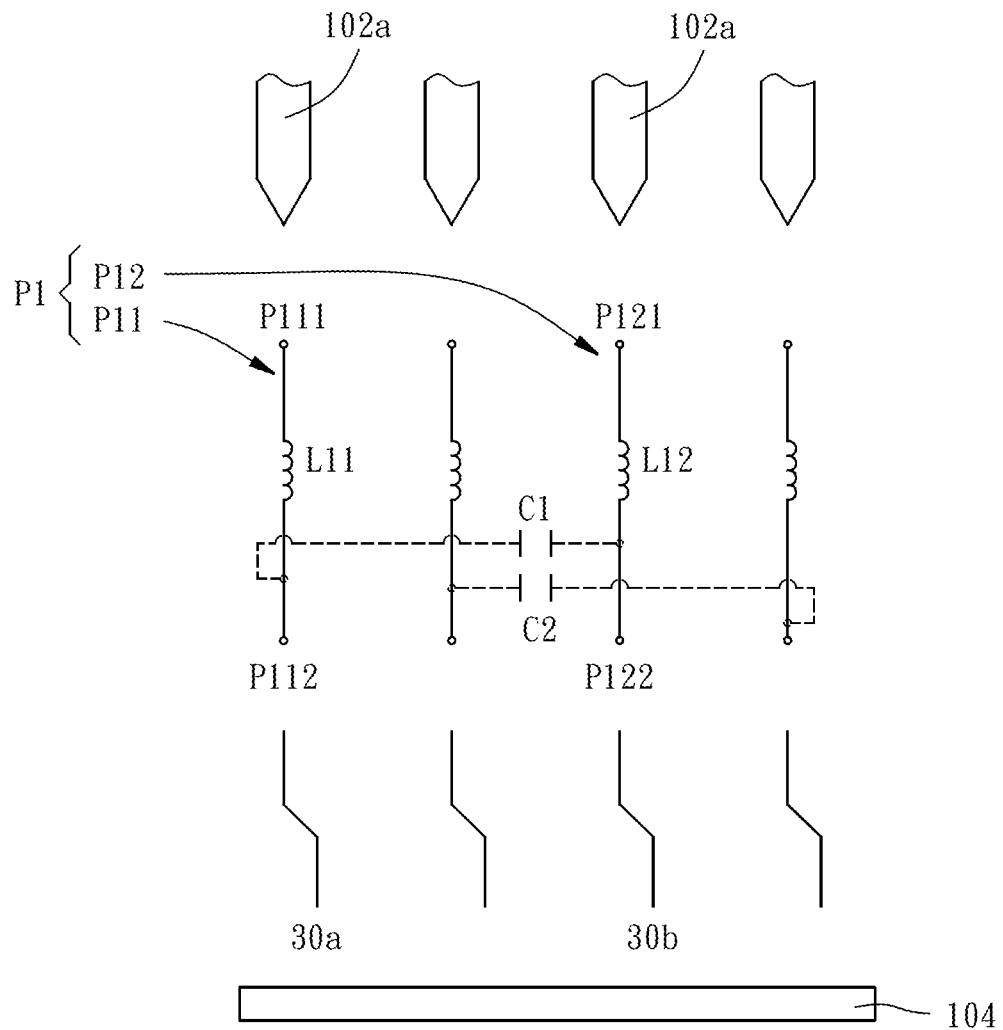
FIG. 4 is similar to FIG. 3, wherein paths of the signal path switching module for transmitting direct-current or low-frequency signals from a tester are shown by solid lines.

Because the first and second test channel sets P1 and P2 are identical to each other in structure and function, only the first test channel set P1 is specified in the following description for concisely illustrating the operation of the signal path switching module 40. Referring to FIG. 4, when the first test channel set P1 receives the direct-current or low-frequency test signal outputted by the tester 102, the inductors L11 and L12 are in the short-circuit or low-resistance status and the capacitor C1 is in the open-circuit or high-resistance status. At this time, as the path drawn by solid lines shown in FIG. 4, the test signal will be transmitted to the DUT 104 via the pogo pin 102a of the tester 102, the printed circuit board 10, the connection substrate 20, the first circuit line P11 and the first probe needle 30a, and then transmitted back to the tester 102 via the second probe needle 30b, the second circuit line P12, the connection substrate 20 and the printed circuit board 10, for testing.

Figure 5:
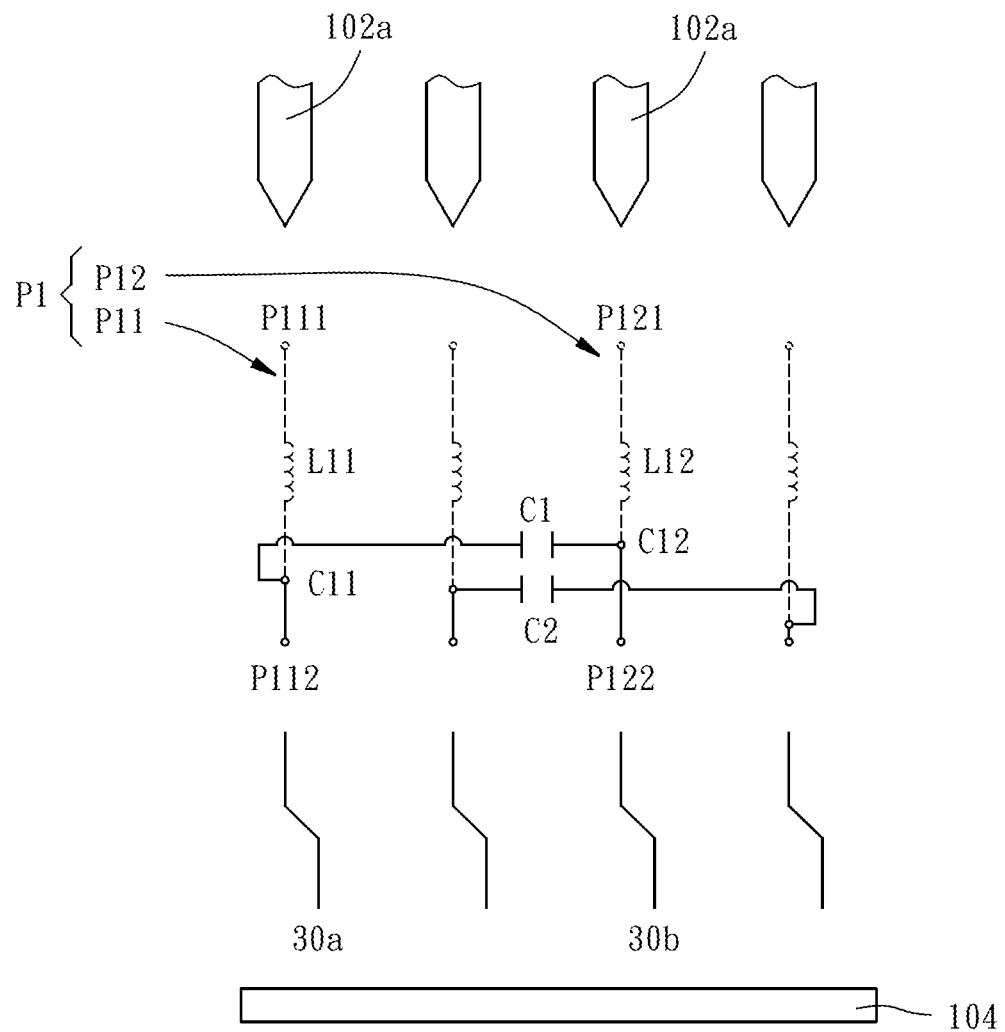
FIG. 5 is similar to FIG. 3, wherein paths of the signal path switching module for transmitting high-frequency loopback test signals from a DUT are shown by solid lines.

On the other hand, as the path drawn by solid lines shown in FIG. 5, when the first test channel set P1 receives the high-frequency loopback test signal outputted by the DUT 104, the inductors L11 and L12 are in the open-circuit or high-resistance status and the capacitor C1 is in the short-circuit or low-resistance status. At this time, the loopback test signal from the DUT 104 will be transmitted back to the DUT 104 via the first probe needle 30a, a part of the first circuit line P11 (i.e. the part between the second contact pad P112 of the first circuit line P11 and the first electric contact C11 of the capacitor C1), the capacitor C1, a part of the second circuit line P12 (i.e. the part between the second contact pad P122 of the second circuit line P12 and the second electric contact C12 of the capacitor C1), and the second probe needle 30b, for testing via a test module (not shown) built in the DUT 104.

It is to be mentioned that the substrate 42 of the signal path switching module 40 in this embodiment is unlimited to be a circuit board. For example, the substrate 42 may be a lead frame, and may be miniaturized to 4-8 mm$^2$ to conform with the practical space requirement. The contact pads exposed on the outside of the encapsulant of the signal path switching module 40 may be, but unlimited to, the elements for external electrical connection, such as leads, solder pads, bumps, and so on, and may be electrically connected with the contact pads located on the lateral periphery surface 23 of the connection substrate 20 by the various feasible manners such as welding, reflowing and wire bonding. Besides, the inductors may, but unlimited to, be the elements having the characteristic of induction, such as chocks, coils, windings, and so on.

It can be understood from the above description that for the signal path switching module 40 provided in the present invention, the passive elements required to compose a set or a plurality of sets of signal paths for being switched to transmit the test signals from the tester 102 or being switched to transmit the loopback test signals from the DUT 104 are encapsulated into a module, and the integrated signal path switching module 40 is disposed on the lateral periphery surface 23 of the connection substrate 20. In this way, unlike the conventional probe card, in the assembly of the probe card of the present invention, it is not required to weld the passive elements such as the capacitors and the inductors one by one on the connection substrate 20 or other substrates, thereby increasing the flexibility of layout design of the signal circuit lines of the connection substrate 20 and enhancing the convenience of assembly of the connection substrate 20. Besides, by means of providing a plurality of sets of test channels in a module with relatively smaller volume and positively using the space on the lateral periphery surface 23, which is not usually used in the general connection substrate 20 of the conventional probe card, for the disposal of the signal path switching module 40, the objectives of efficient space utilization and effective increase of the test channels are attained. Further, in the signal path switching module 40, the specific arrangement of the circuit lines of the substrate 42 and the symmetric arrangement of the passive elements such as the capacitors C1 and C2 and the inductors L11, L12, L21 and L22 on the substrate 42, enable all the paths for transmitting the loopback test signals to be provided with equal length. In this way, when the signals, especially the differential signals, are transmitted, time difference, which may be caused by different lengths of signal transmission paths and may affect the accuracy of the test result, may be avoided. Therefore, the problem that the conventional probe card may have unequal lengths of the signal transmitting paths, caused by directly welding the passive elements such as the capacitors and the inductors one by one on the connection substrate 20 or other substrates, can be also solved. Of course, not only all the paths of the signal path switching module 40 for transmitting the loopback test signals are preferably provided with equal length, but the signal circuit lines in the connection substrate 20 for transmitting the loopback test signals are also preferably provided with equal length to avoid affecting the test result.

Figure 6:
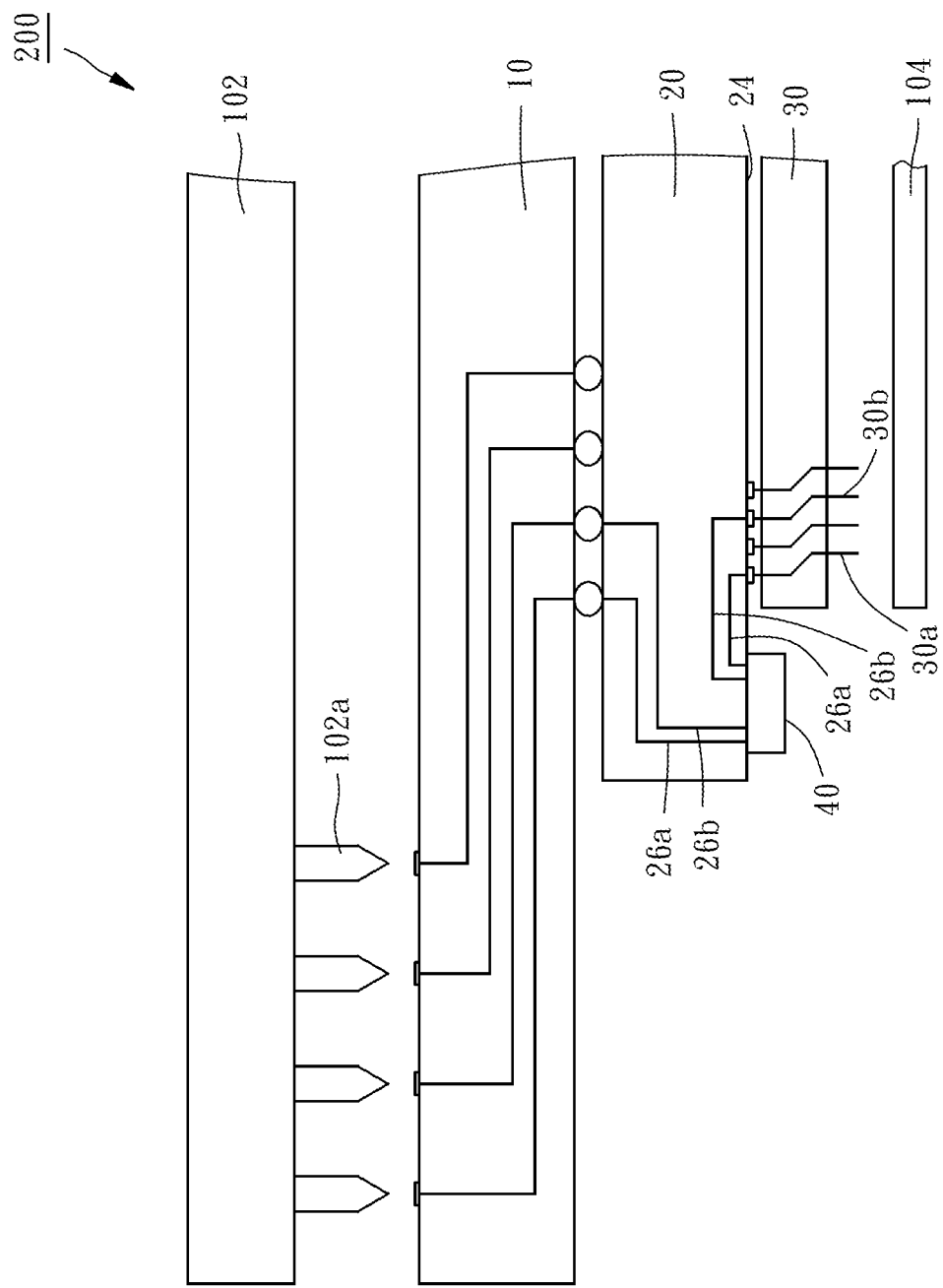
FIG. 6 is a schematic structural view of a probe card according to a second embodiment of the present invention.

Of course, for the efficient and positive space utilization, the signal path switching module 40 is unlimited to be disposed on the lateral periphery surface 23 of the connection substrate 20. For example, FIG. 6 shows a probe card 200 according to a second embodiment of the present invention, which has a structure approximately the same with that of the probe card 100 provided in the first embodiment, except that the signal path switching module 40 in this embodiment is disposed on the bottom surface 24 of the connection substrate 20 and electrically connected with the probe needles 30a and 30b via the signal circuit lines 26a and 26b provided inside or on the surface of the connection substrate 20. Therefore, under the condition that the arrangement of the signal circuit lines of the connection substrate of the presently available probe card is not changed massively, the bottom surface 24 of the connection substrate 20 can be positively utilized, so that the objectives of efficient space utilization, convenient assembly and effective increase of the test channels are attained.

Figure 7:
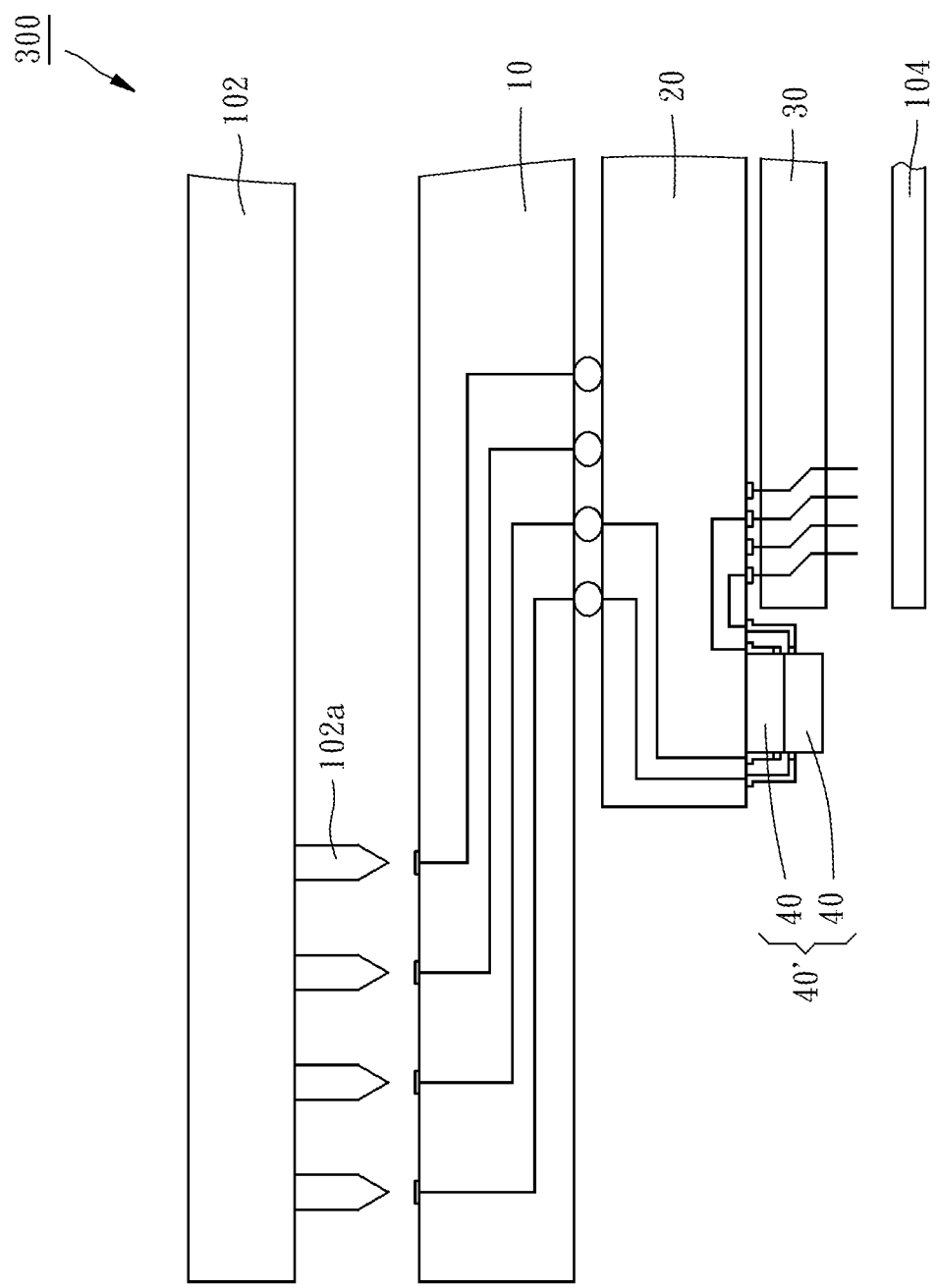
FIG. 7 is a schematic structural view of a probe card according to a third embodiment of the present invention.
Figure 8:
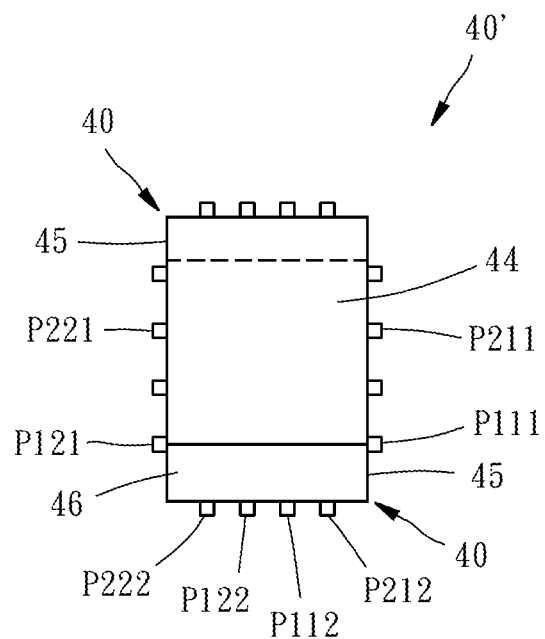
FIG. 8 is a schematic top view of a signal path switching module assembly used in the probe card shown in FIG. 7.
Figure 9:
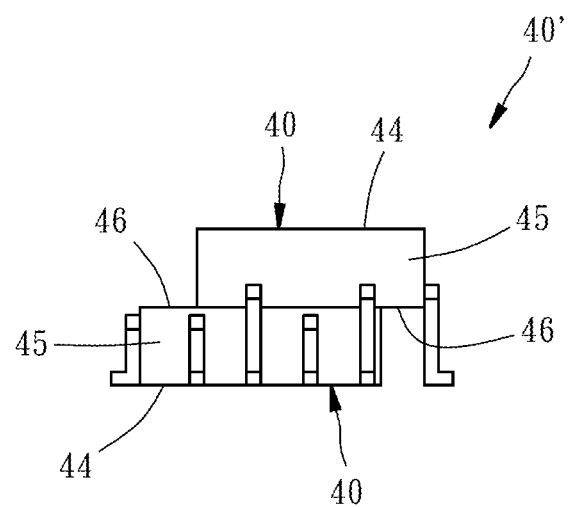
FIG. 9 is a schematic lateral view of the signal path switching module assembly shown in FIG. 8.

In order to provide sufficient test channels in a limited space, a probe card 300 according to a third embodiment of the present invention as shown in FIG. 7 is further provided. The probe card 300 has a structure approximately the same with those of the probe cards 100 and 200 provided in the first and second embodiments, except that the probe card 300 in this embodiment has a signal path switching module assembly 40' composed of two same signal path switching modules 40 mentioned in the aforesaid embodiments, which are piled on one another and disposed on and electrically connected with the bottom surface 24 of the connection substrate 20. As shown in FIGS. 8-9, each of the signal path switching modules 40 has a top surface 44, a bottom surface 46 and a lateral periphery surface 45 connecting the top and bottom surfaces. The first and second contact pads P111, P211, P121, P221, P112, P212, P122 and P222 of the signal path switching module 40 are exposed on the aforesaid lateral periphery surface 45. Besides, in this embodiment, the two signal path switching modules 40 are piled on one another in a way that the bottom surfaces 46 of the signal path switching modules 40 face each other and the signal path switching modules 40 are horizontally displaced at a predetermined distance with respect to each other, so that all of the first and second contact pads are staggered to be electrically connected with the first and second signal circuit lines 26a and 26b of the connection substrate 20. In this way, the signal path switching module assembly 40' can provide four test channel sets in a relatively smaller vertical space, thereby attaining the objectives of efficient space utility and effective increase of the test channels.

It is to be mentioned that the aforesaid two signal path switching modules 40 are unlimited to be the same modules, which means the two modules 40 may be different in the amount of the test channels and the positions of the contact pads. Besides, the two modules 40 are unlimited to be piled on one another in the way that the bottom surfaces thereof face each other but may be piled on one another in a way that the top surface 44 of one of the signal path switching modules 40 faces the bottom surface 46 of the other signal path switching module 40 or the top surfaces 44 of the signal path switching modules 40 face each other as long as all of the first and second contact pads are staggered. Besides, the aforesaid first and second contact pads are unlimited to the lead-type provided in this embodiment, but may be other elements for external electrical connection, such as solder pads, bumps, and so on, and may be electrically connected with the contact pads located on the bottom surface 24 of the connection substrate 20 in various kinds of manners such as welding, reflowing and wire bonding. Furthermore, the signal path switching module assembly 40' is also unlimited to be disposed on the bottom surface 24 of the connection substrate 20. For example, the signal path switching module assembly 40' may be disposed on the lateral periphery surface 23 of the connection substrate 20, like the signal path switching module 40 in the first embodiment.

Figure 10:
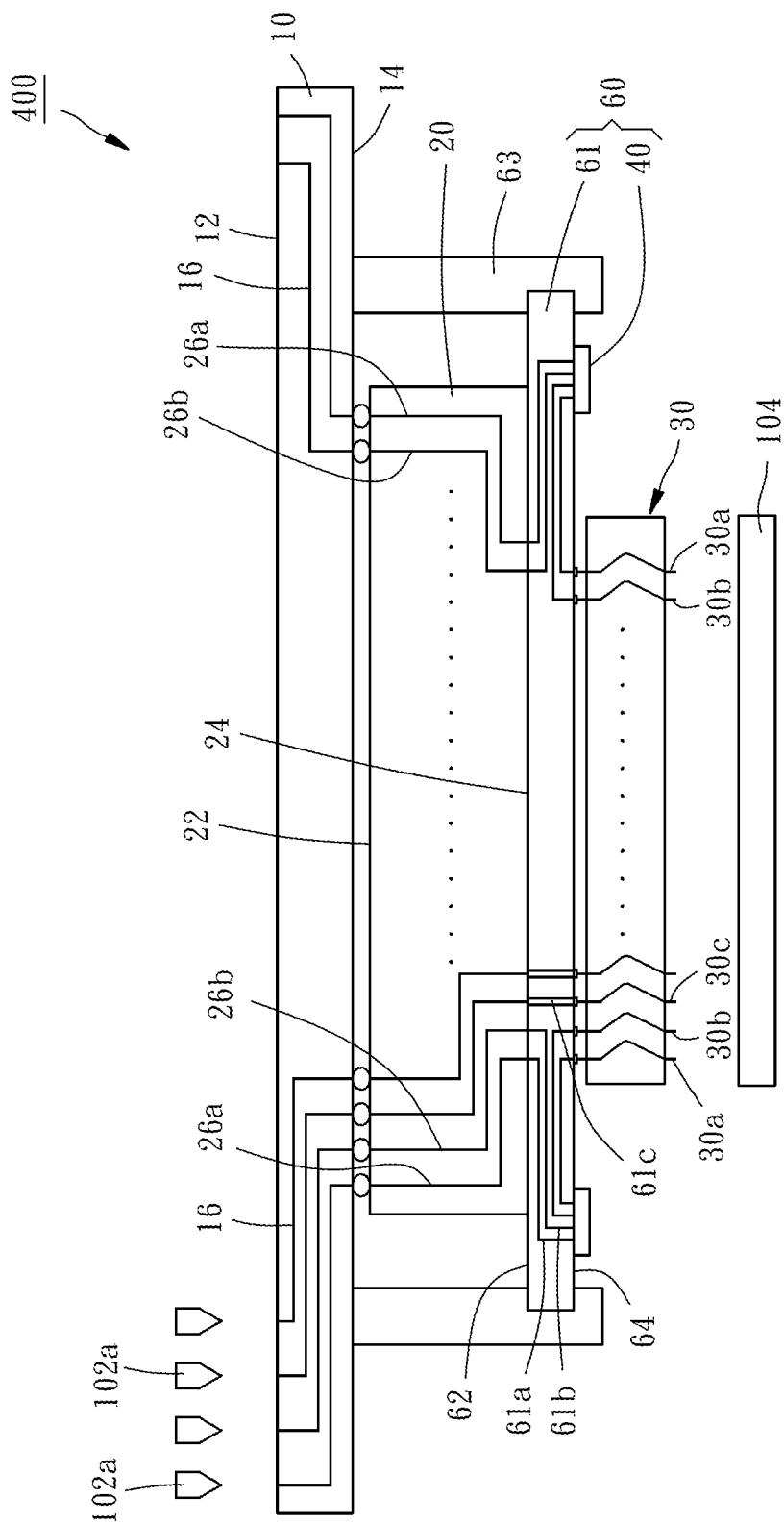
FIG. 10 is a schematic structural view of a probe card according to a fourth embodiment of the present invention.
Figure 11:
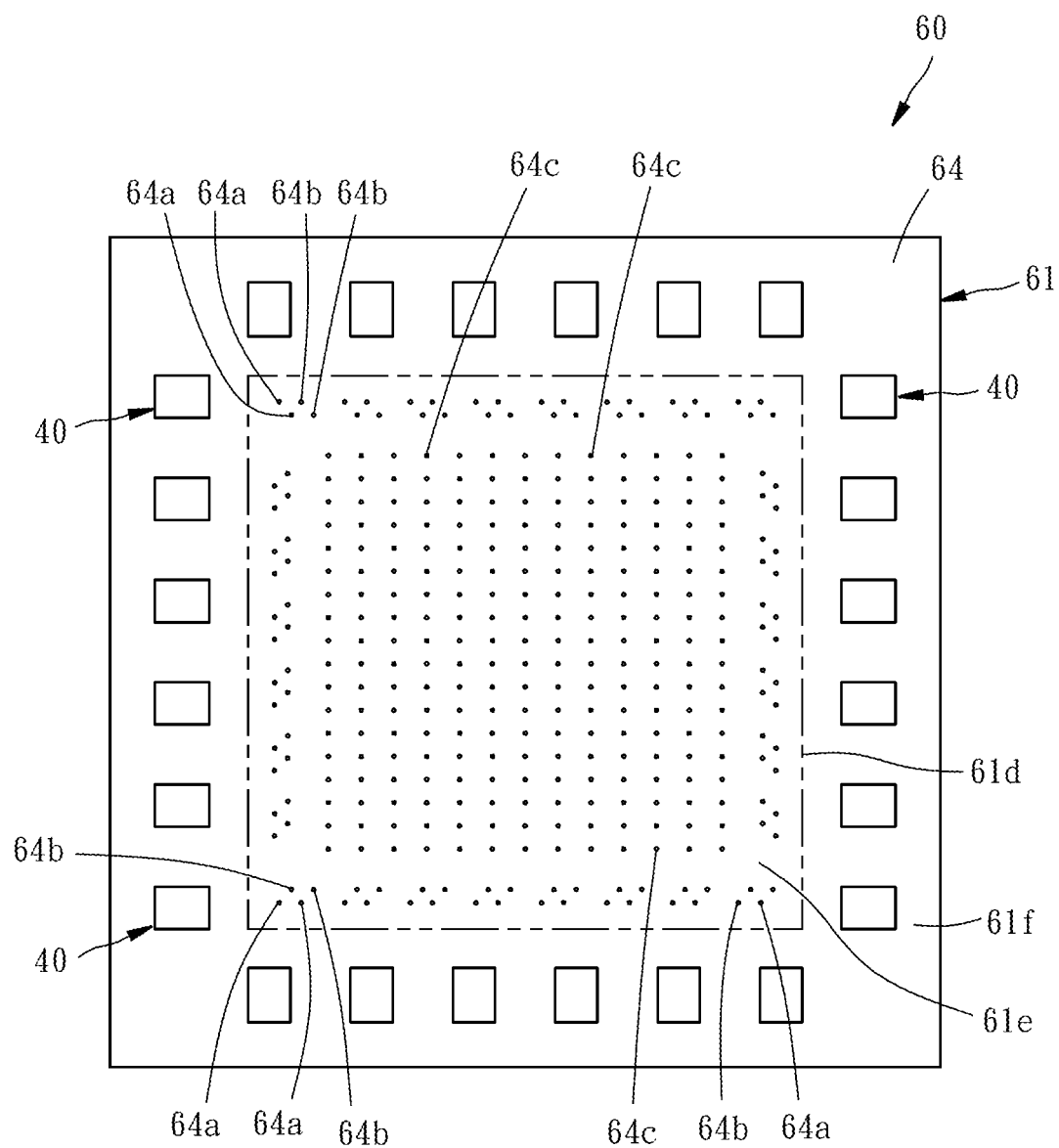
FIG. 11 is a schematic bottom view of a signal channel expanding board of the probe card shown in FIG. 10.

Referring to FIGS. 10-11, a probe card 400 according to a fourth embodiment of the present invention as shown in FIG. 10 is provided. The probe card 400 includes a printed circuit board 10, a connection substrate 20, a probe head 30, and a signal channel expanding board 60. The printed circuit board 10, the connection substrate 20 and the probe head 30 used in this embodiment are the same or similar in structural features thereof with that used in the first and second embodiments, so for the detailed structure thereof, the description of the abovementioned embodiments can be referred to.

Briefly speaking, in this embodiment, the printed circuit board 10 has a top surface 12, a bottom surface 14, and a plurality of signal circuit lines 16 provided between the top and bottom surfaces 12 and 14. The connection substrate 20 has a top surface 22, a bottom surface 24, and a plurality of signal circuit lines provided between the top and bottom surfaces 22 and 24, electrically connected with the signal circuit lines 16 of the printed circuit board 10, and including first signal circuit lines 26a and second signal circuit lines 26b. The probe head 30 is disposed under the connection substrate 20 and likewise has a set or a plurality of sets of first and second probe needles 30a and 30b for transmitting the test signal from the tester 102 or transmitting the loopback test signal from the DUT 104, and other probe needles such as third probe needles 30c only for transmitting the test signal from the tester 102.

This embodiment is different from the abovementioned embodiments in using a signal channel expanding board 60 to provide the demanded signal path switching module 40. Specifically speaking, the signal channel expanding board 60 primarily includes a substrate 61, and one or a plurality of signal path switching modules 40 or signal path switching module assemblies 40' as that provided in the abovementioned embodiments, which are disposed on the substrate 61. The substrate 61 in this embodiment is, but unlimited to, a multilayer organic substrate or a multilayer ceramic substrate. The substrate 61 has a top surface 62, a bottom surface 64, and internal signal circuit lines extending between the top and bottom surfaces 62 and 64. The substrate 61 is mechanically mounted by a fixed seat 63 and electrically connected between the connection substrate 20 and the probe head 30. The internal signal circuit lines of the substrate 61 includes a plurality of sets of first, second and third signal circuit lines 61a, 61b and 61c extending between the top surface 62 and the bottom surface 64, and the substrate 61 is provided on the bottom surface 64 thereof with a plurality of contact pads 64a, 64b and 64c, as shown in FIG. 11, for being abutted by the probe needles.

Specifically speaking, as shown in the bottom view of the signal channel expanding board 60 in FIG. 11, the substrate 61 has a central area 61e indicated and encircled by an imaginary line 61d and located between the connection substrate 20 and the probe head 30, and a peripheral area 61f surrounding around the central area 61e. The central area 61e is provided with the contact pads 64a, 64b and 64c electrically connected with the first, second and third signal circuit lines 61a, 61b and 61c of the substrate 61.

The signal path switching modules 40 used in this embodiment are the same with that disclosed in FIGS. 2-5.

The signal path switching modules 40 are disposed in the peripheral area 61f of the bottom surface 64 of the substrate 61 and located around the periphery of the probe head 30. The first and second circuit lines of the signal path switching module 40, such as the first and second circuit lines P11 and P12, are electrically connected with the first and second signal circuit lines 61a and 61b of the substrate 61.

The top ends of the first and second probe needles 30a and 30b of the probe head 30 are respectively abutted on the contact pads 64a and 64b located on the bottom surface 64 of the substrate 61 so that the test signal from the tester 102 will be transmitted between the tester 102 and the DUT 104 via the pogo pin 102a of the tester 102, the printed circuit board 10, the connection substrate 20, the first and second signal circuit lines 61a and 61b of the substrate 61 of the signal channel expanding board 60, the first and second circuit lines P11 and P12 of the signal path switching module 40, and the first and second probe needles 30a and 30b. The loopback test signal from the DUT 104 will be transmitted back to the DUT 104 via the first probe needle 30a, the first signal circuit line 61a of the substrate 61, a part of the first circuit line P11, the capacitor C1 and a part of the second circuit line P12 of the signal path switching module 40, the second signal circuit line 61b of the substrate 61, and the second probe needle 30b.

In another aspect, the top ends of the third probe needles 30c of the probe head 30 are respectively abutted on the contact pads 64c located on the bottom surface 64 of the substrate 61 so that the test signal from the tester 102 will be transmitted between the tester 102 and the DUT 104 via the pogo pin 102a of the tester 102, the printed circuit board 10, the connection substrate 20 and the third signal circuit line 61c of the substrate 61 of the signal channel expanding board 60 and the third probe needle 30c, without passing through the signal path switching module 40.

It can be understood from the above description that for the probe card 400 provided in this embodiment, the signal channel expanding board 60 disposed between the connection substrate 20 and the probe head 30 is used for providing relatively more space around the periphery of the probe head 30 for the disposal of the signal path switching modules 40, thereby providing relatively more high-frequency loopback test channels. In this way, under the condition that the arrangement of the test contact pads of the presently available probe card is not changed, the signal path switching module 40 can be installed relatively more easily, and the additionally installed signal channel expanding board 60 can massively increase the amount of the high-frequency loopback test channels so that the probe card can be customized according to the requirements of the client.

Figure 12:
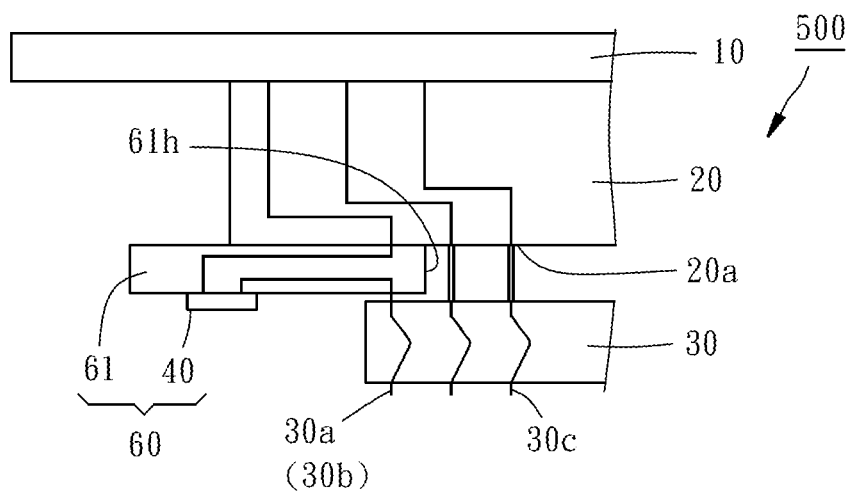
FIG. 12 is a schematic structural view of a probe card according to a fifth embodiment of the present invention.
Figure 13:
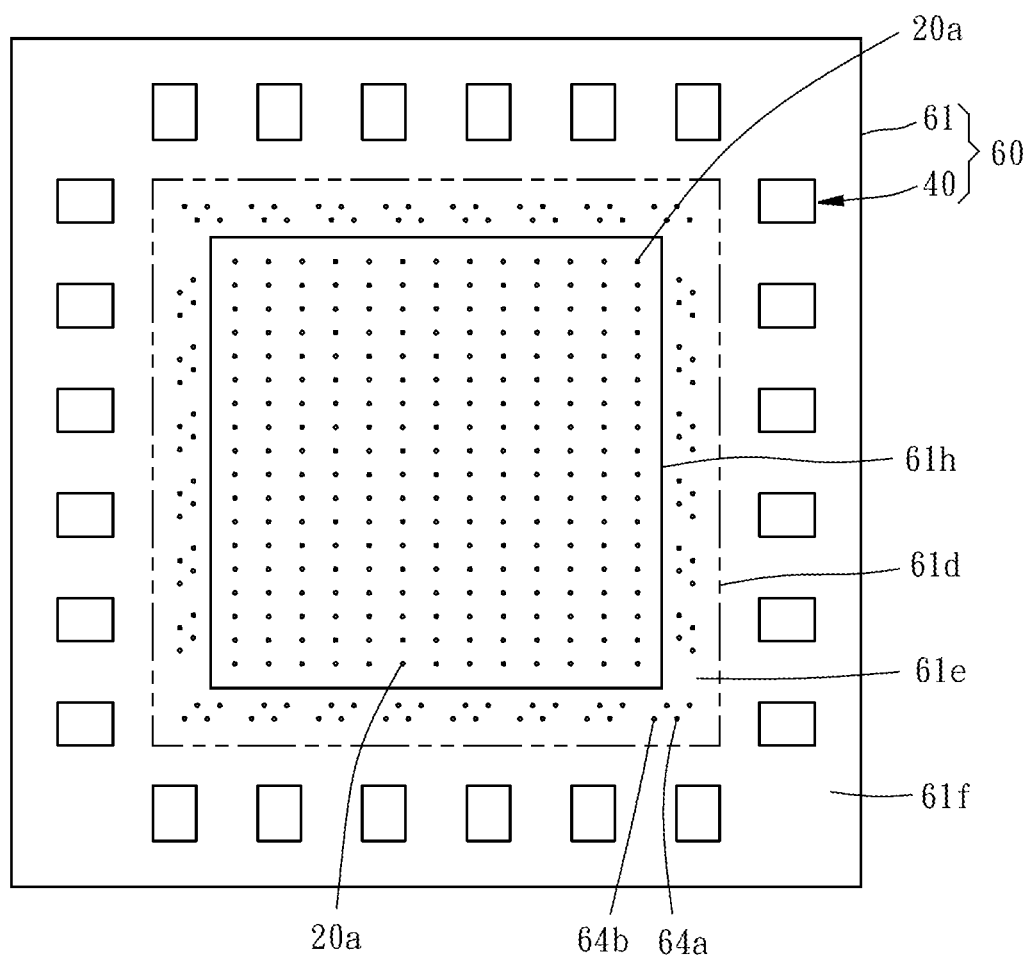
FIG. 13 is a schematic bottom view of a signal channel expanding board and a connection substrate of the probe card shown in FIG. 12.

It is to be further mentioned that the signal channel expanding board 60 used in the abovementioned embodiment may have various kinds of modifications. For example, a probe card 500 according to a fifth embodiment of the present invention and a signal channel expanding board 60 thereof are schematically drawn in FIGS. 12 and 13, respectively. As shown in FIG. 13, the substrate 61 of the signal channel expanding board 60 has a central area 61e indicated and encircled by an imaginary line 61d and located between the connection substrate 20 and the probe head 30, and a peripheral area 61f surrounding around the central area 61e. The central area 61e is provided with an opening 61h penetrating through the top and bottom surfaces of the substrate, and a plurality of contact pads 64a and 64b provided around the periphery of the opening 61h for being abutted by the first and second probe needles 30a and 30b of the probe head 30. The signal path switching module 40 is disposed in the peripheral area 61f, located around the periphery of the probe head 30, and electrically connected with the contact pads 64a and 64b via the signal circuit lines provided inside or on the surface of the substrate 61. In assembly of the probe card 500, the first and second probe needles 30a and 30b of the probe head 30 are respectively abutted on the aforesaid contact pads 64a and 64b, so that the first and second probe needles 30a and 30b can transmit the test signal from the tester 102 or the high-frequency loopback test signal from the DUT 104 via the signal path switching module 40. Besides, through the opening 61h, the contact pads 20a on the bottom surface of the connection substrate 20 are exposed out for being abutted by the third probe needles 30c of the probe head 30. In other words, the third probe needles 30c of the probe head in this embodiment are inserted through the opening 61h of the substrate 61 and electrically connected with the plurality of signal circuit lines of the connection substrate 20. As a result, the test signal from the tester 102 transmitted by the third probe needle 30c is not transmitted through the signal path switching module 40.

Figure 14:
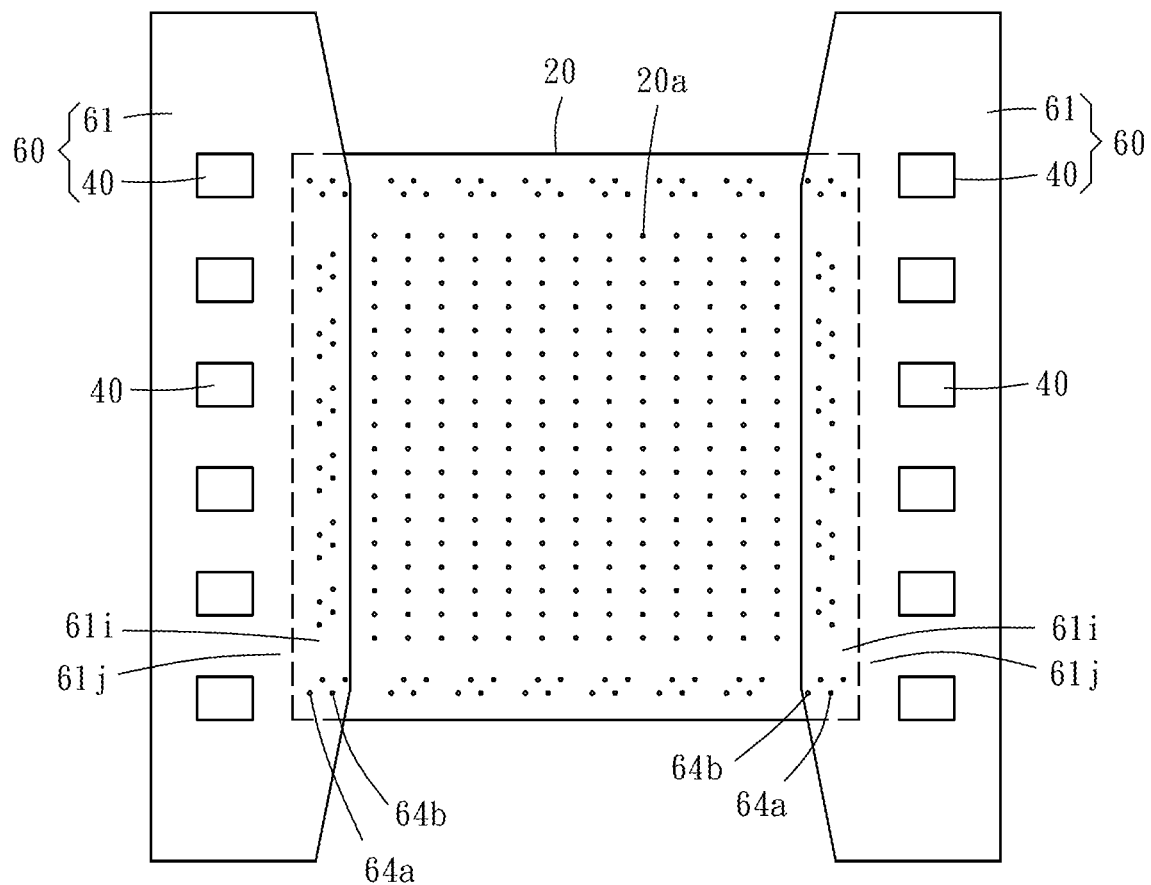
FIG. 14 is a schematic bottom view showing another feasible embodiment of the signal channel expanding board.
Figure 15:
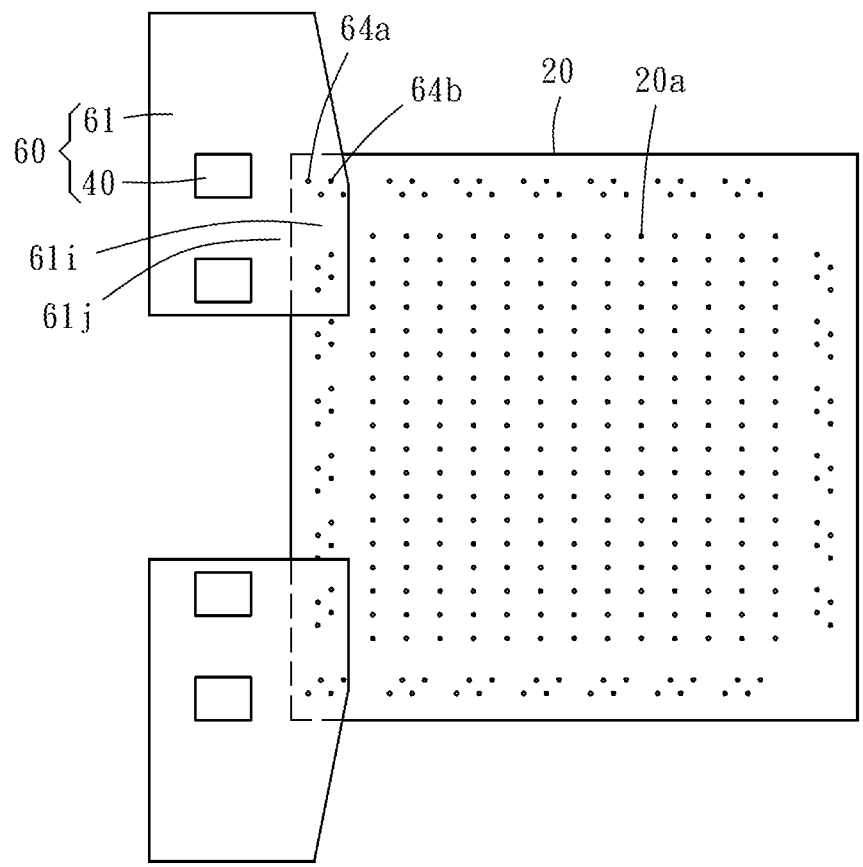
FIG. 15 is a schematic bottom view showing still another feasible embodiment of the signal channel expanding board.
Figure 16:
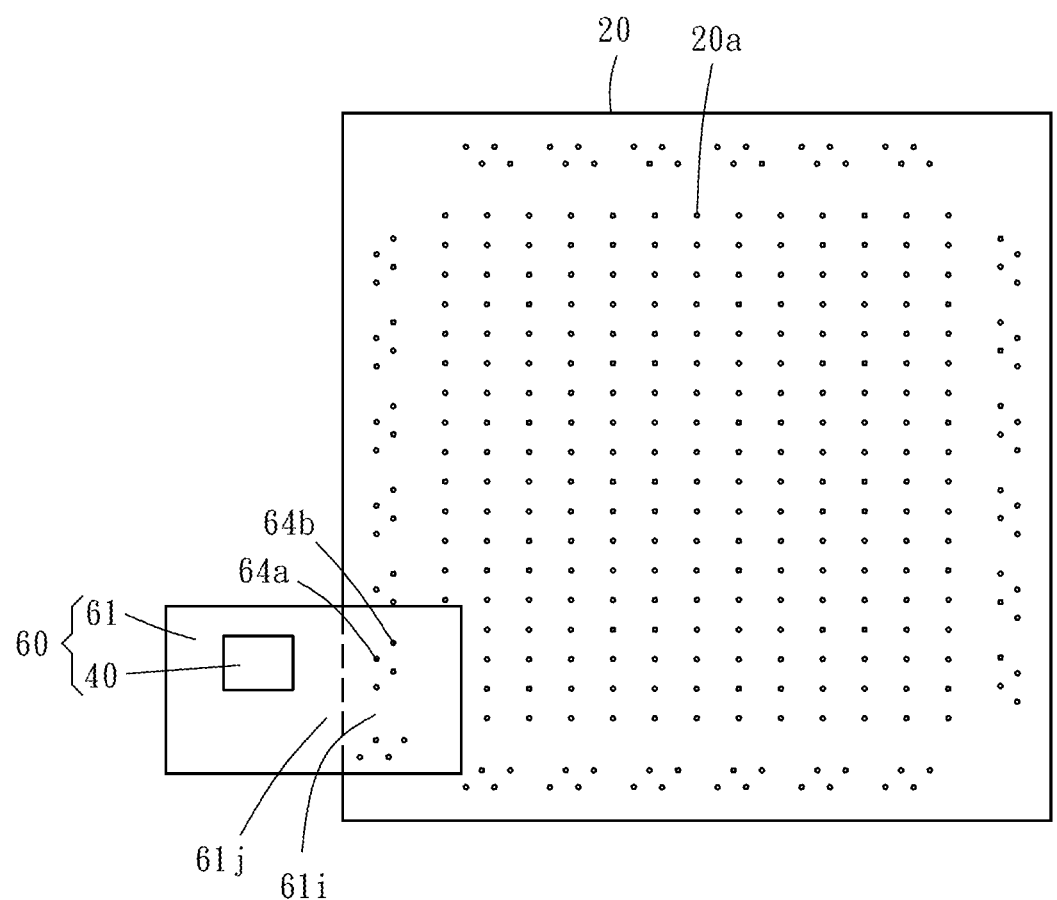
FIG. 16 is a schematic bottom view showing still another feasible embodiment of the signal channel expanding board.

FIGS. 14-16 schematically show other feasible embodiments of the signal channel expanding board 60 respectively. In these embodiments, the signal channel expanding board 60 is disposed on a side or a corner of the connection substrate 20 or the probe head 30. Specifically speaking, the substrate 61 of the signal channel expanding board 60 has an inner area 60i located between the connection substrate 20 and the probe head 30, and an outer area 61j located outside the connection substrate 20 and the probe head 30. The inner area 61i is provided with a plurality of contact pads 64a and 64b for being abutted by the first and second probe needles 30a and 30b of the probe head 30. The signal path switching module 40 is disposed in the outer area 61j and electrically connected with the contact pads 64a and 64b via the signal circuit lines provided inside or on the surface of the substrate 61. In the assembly of the probe card, the first and second probe needles 30a and 30b of the probe head 30 are respectively abutted on the aforesaid contact pads 64a and 64b so that the first and second probe needles 30a and 30b can transmit the test signal from the tester 102 or the high-frequency loopback test signal from the DUT 104 via the signal path switching module 40. Besides, the top ends of the third probe needles 30c of the probe head 30 are directly abutted on the contact pads 20a on the bottom surface of the connection substrate 20 so that the test signal from the tester 102 transmitted by the third probe needle 30c is not transmitted through the signal path switching module 40.

It is to be mentioned that in the embodiments shown in FIGS. 10-16, the signal path switching module 40 is disposed on the bottom surface 64 of the substrate 61, which faces toward the probe head 30. However, for the relatively better efficiency of space utility, the signal path switching module 40 may be also or only disposed on the top surface 62 of the substrate 61, which faces toward the connection substrate 20. Likewise, the signal path switching module assembly 40' used in the abovementioned embodiment may be disposed on the top surface 62 and/or bottom surface 64 of the substrate 61.

In conclusion, by means of encapsulating the electronic components required to compose a set or a plurality of sets of signal test channels into a module 40, and directly disposing the aforesaid module 40 or a module assembly 40' composed of piled modules 40 at a specific position of the connection substrate 20, or disposing the signal channel expanding board 60 provided with the aforesaid module 40 or module assembly 40' between the connection substrate 20 and the probe head 30, the present invention can provide relatively more test channels in a limited space without the need of welding the passive elements such as capacitors and inductors one by one on the connection substrate 20, thereby attaining the objectives of efficient space utilization, convenient assembly and effective increase of the test channels.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A probe card for being used between a tester and a device under test to transmit a test signal from the tester between the tester and the device under test or transmit a loopback test signal from the device under test back to the device under test, the probe card comprising:
   a printed circuit board having a top surface, a bottom surface, and a plurality of signal circuit lines extending between the top and bottom surfaces for being electrically connected with the tester;
   a connection substrate disposed under the printed circuit board and having a top surface, a bottom surface, a lateral periphery surface connecting the top and bottom surfaces of the connection substrate, and a plurality of signal circuit lines extending between the top and bottom surfaces of the connection substrate and electrically connected with the signal circuit lines of the printed circuit board, the signal circuit lines of the connection substrate comprising at least one first signal circuit line and at least one second signal circuit line;
   a probe head disposed under the connection substrate and having at least one first probe needle electrically connected with the at least one first signal circuit line of the connection substrate, and at least one second probe needle electrically connected with the at least one second signal circuit line of the connection substrate; and
   a signal path switching module disposed on one of the lateral periphery surface and the bottom surface of the connection substrate and having at least one test channel set, the test channel set comprising:
      a first circuit line having a first contact pad electrically connected with the first signal circuit line of the connection substrate, a second contact pad electrically connected with the first probe needle, and a first inductor located between the first and second contact pads;
      a second circuit line having a first contact pad electrically connected with the second signal circuit line of the connection substrate, a second contact pad electrically connected with the second probe needle, and a second inductor located between the first and second contact pads of the second circuit line; and
      a capacitor having a first electric contact and a second electric contact, the first electric contact of the capacitor being electrically connected between the second contact pad of the first circuit line and the first inductor, the second electric contact of the capacitor being electrically connected between the second contact pad of the second circuit line and the second inductor;
   wherein the test signal from the tester is transmitted via the printed circuit board, the connection substrate, the first and second circuit lines of the signal path switching module and the first and second probe needles; the loopback test signal from the device under test is transmitted back to the device under test via the first probe needle, a part of the first circuit line, the capacitor and a part of the second circuit line of the signal path switching module, and the second probe needle.

2. The probe card as claimed in claim 1, wherein the signal path switching module is disposed on the bottom surface of the connection substrate and located around a periphery of the probe head.

3. The probe card as claimed in claim 1, wherein the first circuit line and the second circuit line are arranged in the signal path switching module symmetrically to each other with respect to a central line of the signal path switching module.

4. The probe card as claimed in claim 1, wherein the signal path switching module comprises two said test channel sets, and circuit lines of the two test channel sets for transmitting said loopback test signals respectively have a same length.

5. The probe card as claimed in claim 4, wherein the capacitors of the two test channel sets are disposed at a center of the signal path switching module; the first and second inductors of the two test channel sets are disposed around peripheries of the capacitors of the two test channel sets; the first contact pads of the first circuit lines of the two test channel sets are disposed on a first side of the signal path switching module; the second contact pads of the first and second circuit lines of the two test channel sets are disposed on a second side of the signal path switching module, and the second side is located adjacent to the first side; the first contact pads of the second circuit lines of the two test channel sets are disposed on a third side of the signal path switching module, and the third side is located opposite to the first side and adjacent to the second side.

6. The probe card as claimed in claim 1, wherein the probe card comprises two said signal path switching modules; each of the signal path switching modules has a top surface and a bottom surface; the two signal path switching modules are piled on one another in one of manners that the top surface of one of the signal path switching modules faces the bottom surface of the other signal path switching module, the bottom surfaces of the signal path switching modules face each other and the top surfaces of the signal path switching modules face each other, and all of the first and second contact pads of the two signal path switching modules are staggered.

7. A probe card for being used between a tester and a device under test to transmit a test signal from the tester between the tester and the device under test or transmit a loopback test signal from the device under test back to the device under test, the probe card comprising:
   a printed circuit board having a top surface, a bottom surface, and a plurality of signal circuit lines extending between the top and bottom surfaces for being electrically connected with the tester;
   a connection substrate disposed under the printed circuit board and having a plurality of signal circuit lines electrically connected with the signal circuit lines of the printed circuit board;
   a probe head disposed under the connection substrate and having at least one first probe needle and at least one second probe needle; and
   a signal channel expanding board having a substrate and a signal path switching module, the substrate being located between the connection substrate and the probe head and having a plurality of signal circuit lines electrically connected between the signal circuit lines of the connection substrate and the first and second probe needles, the signal path switching module being disposed on the substrate and electrically connected with the signal circuit lines of the substrate, the signal path switching module having at least one test channel set, the test channel set comprising:
  a first circuit line having a first contact pad electrically connected with one of the signal circuit lines of the substrate of the signal channel expanding board, a second contact pad electrically connected with the first probe needle, and a first inductor located between the first and second contact pads;
  a second circuit line having a first contact pad electrically connected with another one of the signal circuit lines of the substrate of the signal channel expanding board, a second contact pad electrically connected with the second probe needle, and a second inductor located between the first and second contact pads of the second circuit line; and
  a capacitor having a first electric contact and a second electric contact, the first electric contact of the capacitor being electrically connected between the second contact pad of the first circuit line and the first inductor, the second electric contact of the capacitor being electrically connected between the second contact pad of the second circuit line and the second inductor;
  wherein the test signal from the tester is transmitted via the printed circuit board, the connection substrate, the first and second circuit lines of the signal path switching module of the signal channel expanding board and the first and second probe needles; the loopback test signal from the device under test is transmitted back to the device under test via the first probe needle, a part of the first circuit line, the capacitor and a part of the second circuit line of the signal path switching module, and the second probe needle.

8. The probe card as claimed in claim 7, wherein the substrate of the signal channel expanding board has a central area located between the connection substrate and the probe head, and a peripheral area surrounding around the central area; the central area is provided with a plurality of contact pads electrically connected with the plurality of signal circuit lines of the substrate, and the first and second probe needles are in electrical contact with the plurality of contact pads; the signal path switching module is disposed in the peripheral area and located around a periphery of the probe head.

9. The probe card as claimed in claim 8, wherein the probe head further comprises a plurality of third probe needles in electrical contact with the plurality of contact pads of the central area of the substrate and electrically connected with the plurality of signal circuit lines of the connection substrate via the plurality of signal circuit lines of the substrate but not via the signal path switching module.

10. The probe card as claimed in claim 7, wherein the substrate of the signal channel expanding board has an opening and a plurality of contact pads provided around a periphery of the opening, located between the connection substrate and the probe head and electrically connected with the plurality of signal circuit lines of the substrate; the first and second probe needles are in electrical contact with the plurality of contact pads of the substrate of the signal channel expanding board; the signal path switching module is disposed outside the plurality of contact pads of the substrate of the signal channel expanding board and located around a periphery of the probe head; the probe head further comprises a plurality of third probe needles inserted through the opening of the substrate and electrically connected with the plurality of signal circuit lines of the connection substrate.

11. The probe card as claimed in claim 7, wherein the substrate of the signal channel expanding board has an inner area and an outer area; the inner area is located between the connection substrate and the probe head and provided with a plurality of contact pads electrically connected with the plurality of signal circuit lines of the substrate; the first and second probe needles are in electrical contact with the plurality of contact pads of the substrate of the signal channel expanding board; the signal path switching module is disposed in the outer area and located around a periphery of the probe head; the probe head further comprises a plurality of third probe needles electrically connected with the plurality of signal circuit lines of the connection substrate without via the signal channel expanding board.

12. The probe card as claimed in claim 7, wherein the substrate of the signal channel expanding board has a top surface facing toward the connection substrate and a bottom surface facing toward the probe head, and the signal path switching module is disposed on one of the top and bottom surfaces of the substrate.

13. The probe card as claimed in claim 12, wherein the first circuit line and the second circuit line are arranged in the signal path switching module symmetrically to each other with respect to a central line of the signal path switching module.

14. The probe card as claimed in claim 12, wherein the signal path switching module comprises two said test channel sets, and circuit lines of the two test channel sets for transmitting said loopback test signals respectively have a same length.

15. The probe card as claimed in claim 12, wherein the probe card comprises two said signal path switching modules; each of the signal path switching modules has a top surface and a bottom surface; the two signal path switching modules are piled on one another in one of manners that the top surface of one of the signal path switching modules faces the bottom surface of the other signal path switching module, the bottom surfaces of the signal path switching modules face each other and the top surfaces of the signal path switching modules face each other, and all of the first and second contact pads of the two signal path switching modules are staggered; the two signal path switching modules are disposed on the bottom surface of the substrate.

16. A signal path switching module assembly for being used between a tester and a device under test to transmit a test signal from the tester between the tester and the device under test and transmit a loopback test signal from the device under test back to the device under test, the signal path switching module assembly comprising two signal path switching modules piled on one another, each of the signal path switching modules comprising at least one test channel set, the test channel set comprising:
  a first circuit line having a first contact pad, a second contact pad, and a first inductor located between the first and second contact pads;
  a second circuit line having a first contact pad, a second contact pad, and a second inductor located between the first and second contact pads of the second circuit line; and
  a capacitor having a first electric contact and a second electric contact, the first electric contact of the capacitor being electrically connected between the second contact pad of the first circuit line and the first inductor, the second electric contact of the capacitor being electrically connected between the second contact pad of the second circuit line and the second inductor;

wherein the test signal from the tester is transmitted via the first and second circuit lines of each of the signal path switching modules; the loopback test signal from the device under test is transmitted back to the device under test via the second contact pad of the first circuit line, a part of the first circuit line, the capacitor, a part of the second circuit line and the second contact pad of the second circuit line of each of the signal path switching modules.

17. The signal path switching module assembly as claimed in claim 16, wherein each of the signal path switching modules has a top surface, a bottom surface, and a lateral periphery surface connecting the top and bottom surfaces, and the first and second contact pads of the first and second circuit lines are exposed on the lateral periphery surface; the signal path switching modules are piled on one another in one of manners that the top surface of one of the signal path switching modules faces the bottom surface of the other signal path switching module, the bottom surfaces of the signal path switching modules face each other and the top surfaces of the signal path switching modules face each other, and all of the first and second contact pads of the signal path switching modules are staggered.

18. The signal path switching module assembly as claimed in claim 16, wherein for each of the signal path switching modules, which is defined with a central line, the first circuit line and the second circuit line are arranged therein symmetrically to each other with respect to the central line.

19. The signal path switching module assembly as claimed in claim 16, wherein each of the signal path switching modules comprises two said test channel sets, and circuit lines of the two test channel sets for transmitting said loopback test signals respectively have a same length.

* * * * *